(12) United States Patent
Huang et al.

(10) Patent No.: US 8,981,421 B2
(45) Date of Patent: Mar. 17, 2015

(54) STRIP-SHAPED GATE-MODULATED TUNNELING FIELD EFFECT TRANSISTOR AND A PREPARATION METHOD THEREOF

(71) Applicant: Peking University, Beijing (CN)

(72) Inventors: Ru Huang, Beijing (CN); Qianqian Huang, Beijing (CN); Yingxin Qiu, Beijing (CN); Zhan Zhan, Beijing (CN); Yangyuan Wang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/130,631

(22) PCT Filed: Jul. 8, 2013

(86) PCT No.: PCT/CN2013/079011
§ 371 (c)(1),
(2) Date: Jan. 2, 2014

(87) PCT Pub. No.: WO2014/079218
PCT Pub. Date: May 30, 2014

(65) Prior Publication Data
US 2014/0203324 A1    Jul. 24, 2014

(30) Foreign Application Priority Data

Nov. 26, 2012  (CN) .......................... 2012 1 0486683

(51) Int. Cl.
*H01L 29/78* (2006.01)
*H01L 29/08* (2006.01)
(Continued)

(52) U.S. Cl.
CPC ............ *H01L 29/78* (2013.01); *H01L 29/0847* (2013.01); *H01L 29/66477* (2013.01);
(Continued)

(58) Field of Classification Search
USPC ..................... 257/105, E21.62, 408, E21, 43; 438/197, 163, 301
See application file for complete search history.

(56) References Cited

U.S. PATENT DOCUMENTS

2006/0147983 A1    7/2006  O'uchi
2007/0178650 A1    8/2007  Chen et al.
2013/0221407 A1*   8/2013  Hou et al. ..................... 257/192

FOREIGN PATENT DOCUMENTS

CN    101006338 A    7/2007
CN    102005481 A    4/2011
(Continued)

OTHER PUBLICATIONS

International Search Report (ISA/CN) for International Application No. PCT/CN2013/079011, mailed Oct. 17, 2013, 5 pages.

*Primary Examiner* — Cathy N Lam
(74) *Attorney, Agent, or Firm* — Foley & Lardner LLP; Antoinette F. Konski; Zhenhai Fu

(57) ABSTRACT

The present invention discloses a strip-shaped gate-modulated tunneling field effect transistor and a preparation method thereof, belonging to a field of field effect transistor logic device and the circuit in CMOS ultra large scale integrated circuit (ULSI). The tunneling field effect transistor includes a control gate, a gate dielectric layer, a semiconductor substrate, a highly-doped source region and a highly-doped drain region, where the highly-doped source region and the highly-doped drain region lie on both sides of the control gate, respectively, the control gate has a strip-shaped structure with a gate length greater than a gate width, and at one side thereof is connected to the highly-doped drain region and at the other side thereof extends laterally into the highly-doped source region; a region located below the control gate is a channel region; and the gate width of the control gate is less than twice width of a source depletion layer. The device modulates the source-side tunneling junction by using the strip-shaped gate structure, achieves the effect equivalent to that the source junction has a steep doping concentration gradient, and improves the TFET device performance; and the preparation method thereof is simple.

9 Claims, 2 Drawing Sheets

(51) Int. Cl.
*H01L 29/66* (2006.01)
*H01L 29/423* (2006.01)
*H01L 29/739* (2006.01)

(52) U.S. Cl.
CPC .... *H01L29/42312* (2013.01); *H01L 29/42364* (2013.01); *H01L 29/66356* (2013.01); *H01L 29/7391* (2013.01)
USPC ................ 257/105; 257/E21.62; 257/E21.43; 257/408; 438/197; 438/163; 438/301

(56) References Cited

FOREIGN PATENT DOCUMENTS

| | | |
|---|---|---|
| CN | 102157559 A | 8/2011 |
| CN | 102945861 A | 2/2013 |
| CN | 102983168 A | 3/2013 |
| WO | WO-2010/067214 A1 | 6/2010 |

* cited by examiner ures of merit: low leakage current, low sub-threshold slope, low operating voltage and low power consumption, and so on. However, due to the limitation of source
STRIP-SHAPED GATE-MODULATED TUNNELING FIELD EFFECT TRANSISTOR AND A PREPARATION METHOD THEREOF

CROSS REFERENCE TO RELATED APPLICATIONS

The present application is a national stage application under 35 U.S.C. §371 of International Application No. PCT/CN2013/079011, filed Jul. 8, 2013, which in turn claims priority of Chinese Patent Application No. 201210486683.7 MB filed Nov. 26, 2012, the content of each of which is incorporated herein by reference in its entirety.

TECHNICAL FIELD

The invention belongs to a field of a field effect transistor logic device and the circuit in CMOS ultra large scale integrated circuit (ULSI), and particularly refers to a strip-shaped gate-modulated tunneling field effect transistor and a preparation method thereof.

BACKGROUND OF THE INVENTION

Under the drive of Moore's Law, the feature size of the conventional MOSFET continues to shrink, now has to enter the nanometer scale, consequently, the negative effects such as short channel effect of a device and so on have become more serious. The effects of drain induced barrier lowering, band-to-band tunneling and so on cause a off-state leakage current of a device to increase continually, at the same time, a sub-threshold slope of the conventional MOSFET can not decrease synchronously with the shrink of the device size due to of the limitation by the thermal potential, thereby the device power consumption increases. Now the power consumption concern has become the most serious problem of limiting the device shrink by the same scale.

In order to enable the device to be applied in the field of ultra-low voltage and low power consumption, using a new turn-on mechanism to obtain a device structure with ultra-steep sub-threshold slope and a process and preparation method have become the focus of everyone's attention to small size devices. In recent years, researchers have proposed a possible solution of using tunneling field effect transistor (TFET). Different from the conventional MOSFET, TFET has source and drain with opposite doping types each other, can control the band-to-band tunneling of the reverse biased PIN junction by gate to achieve turn-on, can break through the limitation of the sub-threshold slope 60 mV/dec of the traditional MOSFET, and has a very small leakage current. TFET has many advantages such as low leakage current, low sub-threshold slope, low operating voltage and low power consumption, and so on. However, due to the limitation of source junction tunneling probability and tunneling area, TFET is faced with a problem of small on-state current, which is far less than the traditional MOSFET devices, and this greatly limits the applications of TFET device. In addition, it is difficult to achieve TFET device with a steep sub-threshold slope in the experiment, because it is more difficult to achieve a steep doping concentration gradient at the source junction in the experiment so that the electric field at the tunneling junction is not sufficiently large when the device turns on, which may cause a sub-threshold slope of TFET to degrade relative to the theoretical value. Therefore, it has become a further important issue in connection with TFET device how to achieve a steep doping concentration gradient at the source junction to obtain an ultra-low sub-threshold slope.

SUMMARY OF THE INVENTION

The purpose of the present invention is to provide a strip-shaped gate-modulated tunneling field effect transistor and a preparation method thereof. Under the conditions that are fully compatible with the existing CMOS process, compared with the conventional tunneling field effect transistor, only the gate layout configuration in the structure of this TFET device changes, and the TFET device can equivalently achieve an effect of a steep source junction doping concentration gradient, significantly optimize a sub-threshold slope of TFET device, and at the same time boost a turn-on current of the device.

The technical solutions of the present invention are provided as follows.

A tunneling field effect transistor according to the present invention includes a semiconductor substrate, a highly-doped source region, a highly-doped drain region, a gate dielectric layer, and a control gate, where the highly-doped source region and the highly-doped drain region lie on both sides of the control gate, respectively, and are doped with the different doping type impurities, wherein as compared with the control gate of the conventional tunneling field effect transistor, the control gate in the present invention has a strip-shaped structure with a gate length greater than a gate width, and at one side thereof is connected to the highly-doped drain region and at the other side thereof extends laterally into the highly-doped source region, that is, one portion of the strip-shaped control gate lies between the highly-doped source region and the highly-doped drain region, the other portion of the strip control gate extends into the highly-doped source region; a region located below the control gate is still a channel region; and the highly-doped source region is formed by self-aligning of the strip-shaped control gate and there is no highly-doped source below the strip control gate. The ratio of the length of the one portion of the control gate lying between the highly-doped source region and the highly-doped drain region to the length of the other portion thereof extending into the highly-doped source region is 1:1~1:5. The gate width of the control gate is less than twice width of a source depletion layer, and the width of the source depletion layer has a range of 25 nm~1.5 μm.

Both of the highly-doped source region and the highly-doped drain region have a doping concentration between $1\times10^{19}$ cm$^{-3}$ and $1\times10^{21}$ cm$^{-3}$, and the substrate has a doping concentration between $1\times10^{14}$ cm$^{-3}$ and $1\times10^{17}$ cm$^{-3}$.

A preparation method of the tunneling field effect transistor described above comprises the steps of:

(1) defining an active region on the semiconductor substrate by a shallow trench isolation process;

(2) growing a gate dielectric layer;

(3) depositing a control gate material, and then performing photolithography and etching to form a strip-shaped gate;

(4) exposing a drain doping region by photolithography, and forming a highly-doped drain region by performing ion implantation using a photoresist as a mask;

(5) exposing a source doping region by photolithography, forming a highly-doped source region with an opposite doping type by performing ion implantation using a photoresist and the gate as a mask, and then performing rapid high temperature thermal annealing to activate the doped impurities;

(6) finally proceeding to a general CMOS Back-End-Of-Line, comprising depositing a passivation layer, forming contact holes and performing metallization and so on, that is, achieving the tunneling field effect transistor, as shown in FIG. 5.

In the preparation method described above, the semiconductor substrate in the step (1) is formed of a material selected from a group consisting of Si, Ge, SiGe, GaAs, and the other binary or ternary compound semiconductor in II-VI, III-V and IV-IV groups, silicon on insulator (SOI) and germanium on insulator (GOI).

In the preparation method described above, the gate dielectric layer in the step (2) is formed of a material selected from a group consisting of $SiO_2$, $Si_3N_4$, and high-K gate dielectric material.

In the preparation method described above, a process for growing a gate dielectric layer in the step (2) is selected from one of the processes consisting of: common thermal oxidation, nitrogen-doped thermal oxidation, chemical vapor deposition and physical vapor deposition.

In the preparation method described above, the control gate material in the step (3) is selected from a group consisting of doped polysilicon, metal cobalt, nickel and the other metal and metal silicide.

The present invention has the technical effects as follows:

Firstly, with the same active area, the device can achieve a larger tunneling area by using a strip-shaped gate extending into the source region, and then can obtain a turn-on current higher than that of the conventional TFET;

Secondly, without increasing the process steps, only through simply designing of layout (i.e., the strip-shaped gate profile), the energy band of the channel on the gate lower surface is improved by PN junction depletion effect on both sides of the strip-shaped gate, so the device may obtain a steeper energy band and a narrower tunneling barrier width than the traditional TFET when the band-to-band tunneling occurs, equivalently achieving the effect of a steep doping concentration gradient at the source tunneling junction, and thereby the sub-threshold characteristics of the conventional TFET are significantly improved;

Thirdly, the preparation process of the device is simple, and the preparation method is fully compatible with the conventional MOSFET process.

In short, the device structure modulates the source-side tunneling junction using the strip-shaped gate structure, achieves the effect equivalent to that the source junction has a steep doping concentration gradient and improves the TFET device performance; and the preparation method thereof is simple. Compared with the conventional TFET, in the case of the same process conditions, the same process steps and the same size of the active region, the device can obtain a higher turn-on current and a steeper sub-threshold slope, and can maintain a lower leakage current. This device can be expected to be adopted in the field of the low power consumption, and has a higher practical value.

| | |
|---|---|
| 1—a semiconductor substrate | 2—a gate dielectric layer |
| 3—a control gate | 4—a photoresist |
| 5—a highly-doped drain region | 6—a highly-doped source region with an opposite doping type |

DETAILED DESCRIPTION OF THE EMBODIMENTS

Hereinafter, the present invention will be further illustrated by the examples. It is noted that, the disclosed embodiments are intended to help further understand the present invention, but it will be appreciated to those skilled in the art that various substitutes and modifications may be made without departing from the spirit and scope defined by the present invention and the following claims. Accordingly, the present invention should not be limited to the contents disclosed by the embodiments, and the protected scope of the present invention should be defined by the claims.

Figure 1:
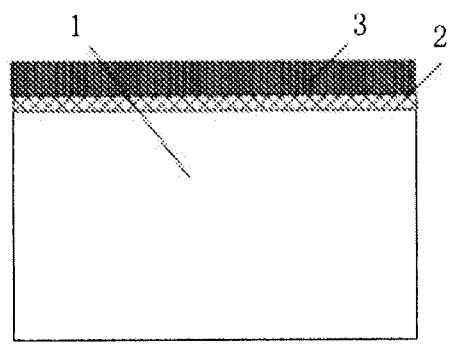
FIG. 1 is a schematic view illustrating the process steps of growing a gate dielectric layer and depositing a gate material on a semiconductor substrate.

A specific example of the preparation method according to the present invention includes the process steps shown in FIG. 1 to FIG. 4b:

1. forming an active region isolation layer on a silicon substrate 1 of a bulk silicon wafer with a crystal orientation (100) by using a shallow trench isolation technology, the substrate having a lightly-doped doping concentration; then thermally growing a gate dielectric layer 2 with $SiO_2$ to a thickness of 1~5 nm; and depositing a gate material 3 with doped polysilicon layer to a thickness of 150~300 nm, as shown in FIG. 1.

Figures 2A, 2B:
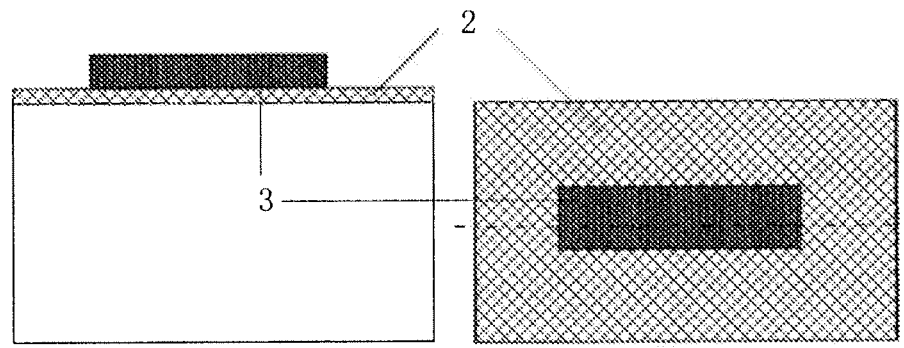
FIG. 2a is a cross-section view of a device, taken along the dotted line in FIG. 2b, after a control gate is formed by photolithography and etching.
FIG. 2b is a top view of the device.

2. forming a pattern for a strip-shaped gate with a width of typically 1 μm by photolithography, and etching the gate material 3 till the gate dielectric layer 2, as shown in FIG. 2a and FIG. 2b.

Figures 3A, 3B:
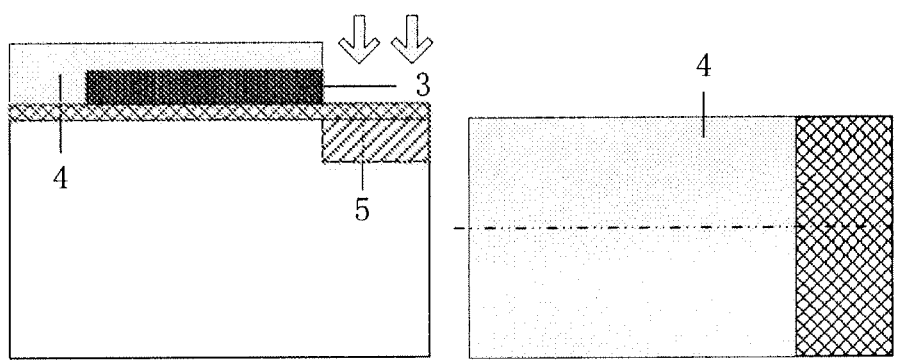
FIG. 3a is a cross-section view of the device, taken along a dotted line in FIG. 3b, after a drain region is exposed by photolithography and a highly-doped drain region is formed by ion implantation.
FIG. 3b is a top view of the device.

3. forming a pattern for a drain region by photolithography, and forming a highly-doped P+ drain region 5 by performing P+ ion implantation, using a photoresist 4 as a mask, with an ion implanting energy of 40 keV and implanting impurities of $BF_2^+$, as shown in FIG. 3a and FIG. 3b.

Figures 4A, 4B:
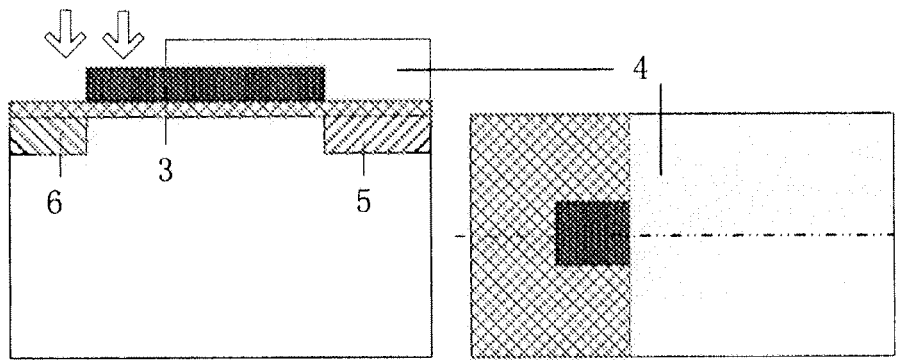
FIG. 4a is a cross-section view of the device, taken along the dotted line in FIG. 4b, after a source region is exposed by photolithography and a highly-doped source region with an opposite doping type is formed by ion implantation.
FIG. 4b is a corresponding top view of the device.

4. forming a pattern of a source region by photolithography, forming a highly-doped N+ source region 6 by performing N+ ion implantation, using a photoresist and the gate as a mask, with an ion implanting energy of 50 keV and implanting impurities of $As^+$, as shown in FIG. 4a and FIG. 4b; and performing a rapid thermal annealing to activate the impurities doped in the source region and drain region.

Figure 5:
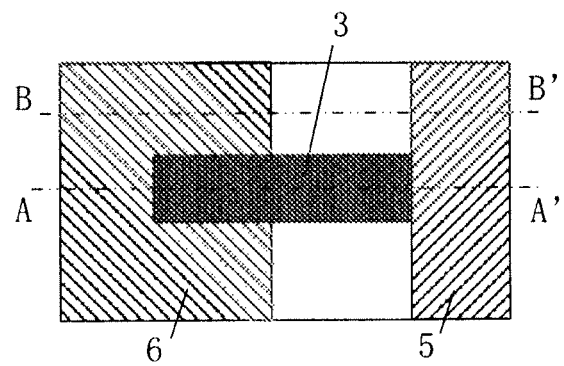
FIG. 5 is a top view of the device of strip-shaped gate-modulated tunneling field effect transistor of the present invention.
Figures 6A, 6B:
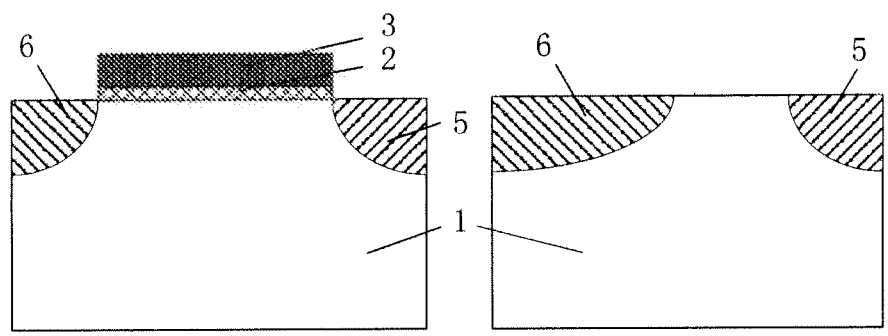
FIG. 6a is a cross-section view of the present invention transistor taken along AA' direction of FIG. 5.
FIG. 6b is a cross-section view of the present invention transistor taken along BB' direction of FIG. 5.

5. finally proceeding to a general CMOS Back-End-Of-Line, comprising depositing a passivation layer, forming a contact hole, and performing metallization, that is, achieving a strip-shaped gate-modulated tunneling field effect transistor, as shown in FIGS. 5~6.

Although the present invention has been disclosed by the preferred embodiment above, however, it is not intended to limit the present invention. Without departing from the scope of the present invention technical solution, using the technical method and technical contents disclosed above, a number of possible variations and modifications for the present technical solution may be made, or equivalent embodiments may be modified by those skilled in the art. Therefore, any simple modifications, equivalent changes and modifications in the above embodiments made without departing from the contents of the present invention technical solution and according to the present invention technical spirit are all belongs to the protected scope of the present invention technical solution.

What is claimed is:

1. A tunneling field effect transistor, comprising a semiconductor substrate, a highly-doped source region, a highly-doped drain region, a gate dielectric layer, and a control gate, where the highly-doped source region and the highly-doped drain region lie on both sides of the control gate, respectively, wherein, the control gate has a strip-shaped structure with a gate length greater than a gate width, and at one side thereof is connected to the highly-doped drain region and at the other side thereof extends laterally into the highly-doped source region; a region located below the control gate is a channel region; and the gate width of the control gate is less than twice width of a source depletion layer.

2. The tunneling field effect transistor according to claim 1, wherein a ratio of a length of one portion of the control gate lying between the highly-doped source region and the highly-doped drain region to a length of an other portion thereof extending into the highly-doped source region is 1:1~1:5.

3. The tunneling field effect transistor according to claim 1, wherein the width of the source depletion layer has a range of 25 nm~1.5 µm.

4. The tunneling field effect transistor according to claim 1, wherein, both of the highly-doped source region and the highly-doped drain region have a doping concentration between $1\times10^{19}$ cm$^{-3}$ and $1\times10^{21}$ cm$^{-3}$, and the substrate has a doping concentration between $1\times10^{14}$ cm$^{-3}$ and $1\times10^{17}$ cm$^{-3}$.

5. A preparation method of the tunneling field effect transistor according to claim 1, comprising the steps of:
   1) defining an active region on the semiconductor substrate by a shallow trench isolation process;
   2) growing the gate dielectric layer;
   3) depositing a control gate material, and then performing photolithography and etching to form the strip-shaped gate;
   4) exposing a drain doping region by photolithography, and forming the highly-doped drain region by performing ion implantation using a photoresist as a mask;
   5) exposing a source doping region by photolithography, forming the highly-doped source region with an opposite doping type by performing ion implantation using a photoresist and the gate as a mask, and then performing rapid high temperature thermal annealing to activate implanted impurities;
   6) finally proceeding to a general CMOS Back-End-Of-Line to form the tunneling field effect transistor.

6. The preparation method according to claim 5, wherein a material of the semiconductor substrate in the step 1) is selected from a group consisting of Si, Ge, SiGe, GaAs and other binary or ternary compound semiconductor in II-VI, III-V and IV-VI groups, silicon on insulator and germanium on insulator.

7. The preparation method according to claim 5, wherein a material of the gate dielectric layer in the step 2) is selected from a group consisting of $SiO_2$, $Si_3N_4$, and high-K gate dielectric material.

8. The preparation method according to claim 5, wherein a process for growing a gate dielectric layer in the step 2) is selected from one of the processes consisting of: common thermal oxidation, nitrogen-doped thermal oxidation, chemical vapor deposition and physical vapor deposition.

9. The preparation method according to claim 5, wherein a material of the control gate material in the step 3) is selected from a group consisting of doped polysilicon, metal cobalt, nickel and other metal and metal silicide.

* * * * *